Nov. 10, 1964 R. ZULEEG 3,156,592

MICROALLOYING METHOD FOR SEMICONDUCTIVE DEVICE

Filed April 20, 1959 3 Sheets-Sheet 1

INVENTOR
RAINER ZULEEG

BY Connolly and Hutz

HIS ATTORNEYS

VOLTAGE VS TIME

100 MA CONSTANT CURRENT

INVENTOR
RAINER ZULEEG

Connolly and Hutz
HIS ATTORNEYS

INVENTOR
RAINER ZULEEG
BY *Connolly and Hutz*
HIS ATTORNEYS

United States Patent Office 3,156,592
Patented Nov. 10, 1964

3,156,592
MICROALLOYING METHOD FOR SEMICONDUCTIVE DEVICE

Rainer Zuleeg, North Adams, Mass., assignor to Sprague Electric Company, North Adams, Mass., a corporation of Massachusetts Filed Apr. 20, 1959, Ser. No. 807,481
1 Claim. (Cl. 148—183)

This invention relates to semiconductive devices and to methods for the fabrication thereof. More particularly this invention relates to semiconductive devices and methods that are useful in providing amplifiers and switches with good high frequency response. Still more particularly, this invention relates to microalloying to the thin base region of a high frequency transistor.

In general, a three terminal semiconductive device employs two closely spaced junctions, i.e., transitions in the concentrations of conductivity type determining impurities in a semiconductor body. One junction is referred to as the emitter junction and the other as the collector junction. Many processes are known today for making such junctions, e.g., by controlled variation of impurity concentration in a melt of semiconductive material during crystal growth, or by alloying an appropriate impurity metal with a surface region of a semiconductive body to alter the conductivity thereof in the alloyed region.

These methods are very economical in the fabrication of low frequency transistors, where a variation in depth of alloying or the location of the junction does not critically affect the original base region thickness of the semiconductive body. However, in alloying to the very thin base region of a high frequency transistor, it is very important to maintain a certain depth of alloying, and consequently a precise geometry of the junction. Also, at high frequency operation, it is necessary to employ small area junctions to obtain low transition capacitances (which are proportional to the area).

A new approach of making transistors with very thin base regions, and then alloying to these thin regions has been set forth by Philco Corporation in their microalloy transistor (MAT). (See IRE Transactions on Electron Devices, vol. ED-5, No. 2, April 1958, "Microalloy Transistor," by A. D. Rittman, G. S. Messenger, R. H. Williams and E. Zimmerman.) The method employed to fabricate the junctions is given by A. D. Rittman in U.S. Patent 2,870,052 which teaches the use of radiation heat from a hairpin-shaped wire loop to perform microalloying.

It is an object of this invention to provide a microalloy junction which is superior in some respects to junctions formed by previous techniques.

The present invention relates to a process whereby electrical means and the geometrical and electrical properties of a semiconductor body are used to advantage in determining a prefixed temperature within said semiconductor body, in order to perform a uniform microalloying to said semiconductor base material having one type of conductivity of a metal or metal alloy which promotes the type of conductivity, to thereby produce a p-n junction.

It is another object of this invention to provide a method of forming a microalloy junction which can be accurately controlled in depth of penetration into a semiconductor body by maintaining a predetermined temperature constant. The resulting product is of uniform base width, which is desirable for electrical conformity of the final semiconductor devices.

Another object of this invention is a microalloying method for forming junctions which provide, by proper cooling, a "freezing out" of one type of impurity material added in minute amounts to the material to be microalloyed with the semiconductive base material, latter opposite in conductivity. This requires proper segregation coefficients of the impurity materials and results in a higher injection efficiency of the formed p-n junction. The high injection efficiency is achieved by minute amounts of impurity adjacent to the junction interface concentrated there due to freezing out.

It is still another object of this invention to provide microalloy junctions which are surface clean around the formed junction periphery due to heating effects and evaporation of volatile materials from the surface. This is a desirable side effect and results in low reverse saturation current of the fabricated p-n junction diodes.

These and other objects of this invention will become more apparent upon consideration of the following description taken together with the accompanying drawings in which.

Figure 1:
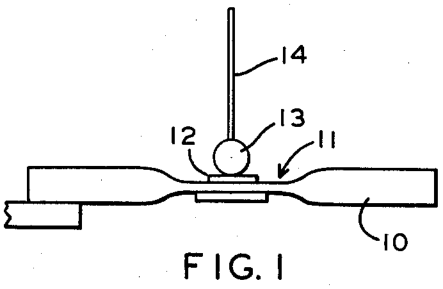
FIGURE 1 is a digarammatic view of a jet-etched and jet-plated blank with a lead-wire not yet attached to the blank by microalloying.

In general, this invention provides a junction between opposite conductivity types of semiconductive materials, such as are used for an emitter in a junction transistor. The invention is applicable to both p-n and n-p junctions. The junction formed by this invention is a microalloy of one type of conductivity promoting material into a semiconductive base material that has been doped with a certain amount of an impurity promoting the opposite type of conductivity. By the method of this invention, regular and controlled junction boundaries are formed. Through electrical and geometrical means, the junction is defined and even predetermined in position within the semiconductive base material.

A microalloy junction between two materials of opposite conductivity may be made by applying a contact of one type of conductivity material to a larger base of opposite type of conductivity. Both types of material may be brought to an elevated temperature, whereby the alloying is accomplished. Upon cooling the system, an alloy junction will form by virtue of recrystallization. Generally, such a junction may be brought about by jet-plating (after jet-etching an indentation to obtain the proper base region thickness) a material capable of promoting one type of conductivity such as indium, onto a blank of semiconductive material doped with a material promoting the opposite type of conductivity, such as germanium doped with an element of the V-group, e.g., Sb. A drop of material, for example, indium, plated onto the very end of a wire, e.g., nickel-cadmium, of 2 mils diameter is brought into contact with the jet plated electrode. By suitable heating, the indium of the drop and the indium of the plating flow together and dissolve a certain amount of the germanium. Upon cooling, the absorbed germanium will recrystallize with opposite conductivity compared to the original, and will form a solid PN junction interface.

The new approach of making microalloy junctions will be described in a system wherein N-type doped with Sb-germanium of 0.6 ohm cm. is the base material and indium is plated onto the surface. The wire to be attached is plated with indium containing 0.25% to 4% of gallium. Of course, various other materials can be used to form a PN junction in N-type germanium. The significance of the process described herein is that a constant current is passed in the forward direction of the plated diode structure to be alloyed, e.g., P-type indium positive and N-type germanium negative. Since in the narrow base region adjacent to the plated electrode the highest resistance will be present, the constant current will create Joule heating in this area, which will spread to the thicker outside portions. Since we have an injecting contact at the emitter, it is also likely that not Joule heating alone, but additional Peltier and Thompson heating phenomena are supporting the heat confinement to the narrow zone in the thin base region. Although estimates of the latter heating effects are minor compared to the Joule heat, they may well be responsible for the excellent heating mechanism obtained in this invention.

For a system where P-type base material has been used and N-type electrodes are plated, the process is also applicable by proper reversal of the constant current source. The forward direction of the plated diode structure is present with a P-type base positive and an N-type electrode negative. In this description this is referred to as an easy flow of electrons. An example would be P-type germanium of 0.6 ohm cm. indium doped, etched and plated with Pb, and microalloyed with a wire plated with a dot of Pb doped with As.

Figure 2:
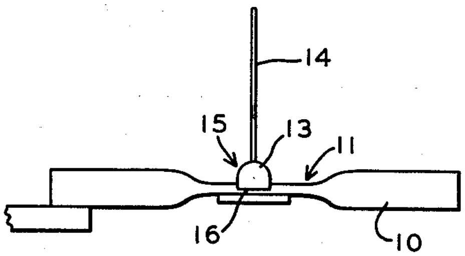
FIGURE 2 is a diagrammatic view of the same blank after the emitter junction has been microalloyed.
Figure 4:
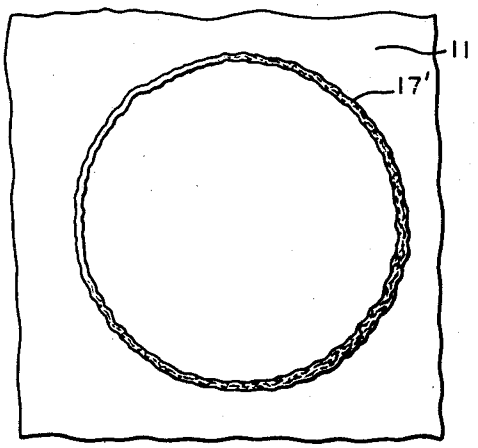
FIGURE 4 is a plan view of the semiconductive base material, not microalloyed and the p-type plated material removed by chemical means.
Figure 3:
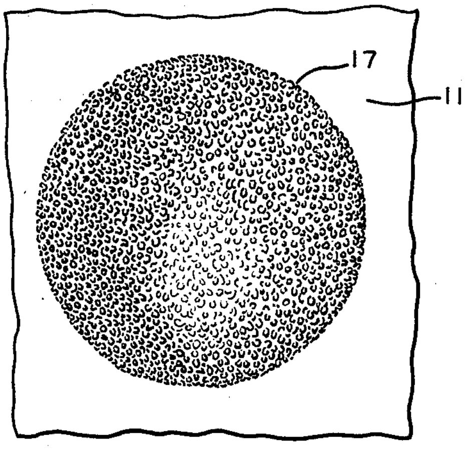
FIGURE 3 is a plan view of the semiconductive base material, microalloyed and the p-type conductivity material removed by chemical means. The textures show the recrystallized germanium which has been dissolved into the p-type material during the fusion cycle.

Referring to FIGURE 1, a base 10 of a blank of germanium (N-type doped) is shown having an etched pit 11 and a jet-plated electrode 12 in the etched pit 11. The jet-plated electrode is made up of indium. A drop of indium 13, containing small amounts of gallium, on a wire contact 14 is shown in contact with the jet-plated electrode 12. The alloy contact resulting from heating the drop 13 and causing a melting and an alloying of the indium and germanium is shown diagrammatically in FIGURE 2. The indium drop 13 slides over the jet-plated electrode 12 and alloys with germanium in this defined area. A PN junction is formed between the emitter 15 and the base 10 along the line 16. The evidence of uniform microalloying within areas as small as $1 \times 10^{-4}$ cm.$^2$ is demonstrated by aid of FIGURES 3 and 4. FIGURE 3 shows the surface of the etched pit 11 with the indium-gallium contact material removed, as by use of a dilute hydrochloric acid solution, without destroying or attacking the germanium material. The germanium of the blank 11 is made up of N-type conductivity outside of the periphery 17 encircling the alloyed area which is of P-type germanium. The uniform textures indicate the even dissolution of germanium into the molten indium-gallium electrode and are parts of the recrystallized junction. FIGURE 4 shows a similar area of a similar germanium blank on which a jet-plated electrode of indium within a periphery 17' has received a conventional indium-gallium solder deposition, but in which there has been no comparable microalloying of the indium and germanium.

Figure 5:
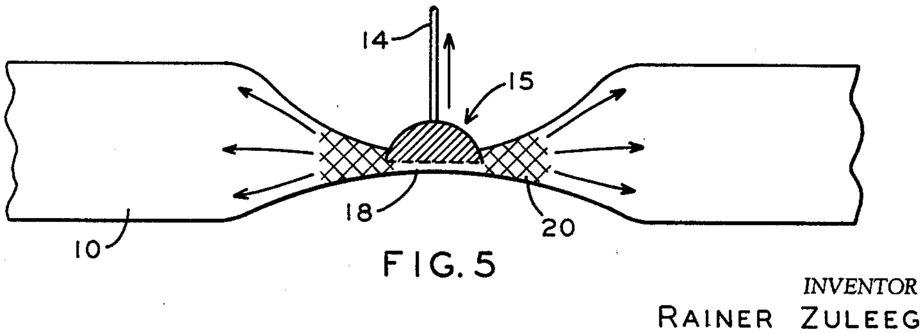
FIGURE 5 is a view partially in section showing a junction in a narrow web base.

In FIGURE 5, the sectional view of the N-type base 10 shows the narrow web 18. The emitter is applied to the base 10 at the thinnest portion of this web 18. The web 18 may be formed by many conventional means, e.g., jet etching. The microalloying of this invention is carried out by applying indium-gallium solder to form the emitter 15 is the manner described above in connection with FIGURES 1 and 2. This microalloying is accomplished by passing a certain positive constant current for a fixed duration through the whisker wire 14. The polarity is chosen so that an easy flow of electrons is established across the junction between emitter 15 and base 10. Since the major resistance contribution in the circuit results from the spreading resistance in the narrow base, the sufficiently high constant current I will create Joule heat. A temperature rise $\Delta T$ is effected proportional to the square of the current ($\Delta T \sim I^2$). Therefore, the temperature in the narrow region is a function of the applied constant current. Since the resistance developing Joule heat lies mainly within the narrow base region, the resulting heating effect also will be confined to the narrow web 13 of the base 10 under and around the emitter junction 16. The power dissipation of the current occurs in the narrow web region outside the junction. It is believed that the relationship of the current flow to the easy flow of electrons is a factor in the heating mechanism.

If a temperature above the melting point of indium (155° C.) is achieved, microalloying will occur. In summary, the emitter 15 is microalloyed to the base 10 at the bottom of the etched pit 11 described in connection with FIGURES 1 and 2. The heat zone extends around and under the emitter 15. This heat zone is circular and the heat is homogeneously distributed in the base 10 and the region surrounding the emitter 15. The maximum temperature is determined by the constant current, the resistivity of the base material, and the geometrical parameters of the structure. Thus, for a given structure, a certain constant current from a timed source, will establish a temperature to cause a predetermined and limited amount of alloying between the critical components of the alloy (indium and germanium). This is a consequence of the phase diagram Ge-In. A feature of this invention is also the "freezing out" of one impurity added to another impurity, e.g., gallium added to indium. Once the molten indium-gallium starts to cool, those portions of the solder 13 closest to the base 10 receive the heat and stay molten for the longest time. The emitter 15 cools from the upper (outer or top) portions inwardly so that final recrystallization takes place in the intimate junction interface 16. During the cooling of emitter 15 from the outer portions inward, the gallium segregates within the emitter towards the junction interface and is finally solidified (in the later stages) in the regions adjacent to the junction with base 10. This is desirable, for gallium has a higher injection efficiency than indium. This gives the final transistor device a higher current amplification factor. The gallium is incorporated in the indium in a proportion from 0.25% to 4%.

Figure 6:
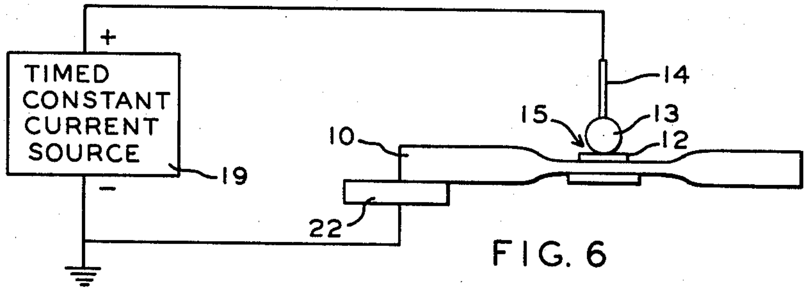
FIGURE 6 is a schematic diagram of equipment for D.C. microalloying according to this invention.

FIGURE 6 shows a schematic diagram of the circuit employed for microalloying emitter contacts to a base. A timed constant current source 19 is connected to a base tab 22 attached to the base 10 and to the plated whisker 14. For a PNP transistor structure (shown), the whisker wire 14 is connected to the positive, and the base tab 22 is connected to the negative, side of the constant current source 19. The current is adjusted in amplitude and time to provide a temperature above the 155° C. melting point of indium in the narrow base region, which substantiates microalloying. The microalloying results of FIGURE 3 for instance are produced by a period of current flow of the order of 2 seconds and a current of the order of 150 milliamperes which provide alloying to a depth of 0.04 mil. The depth of alloy of germanium and indium in the base 10 is related to the temperature reached as determined by the current flow; it is dependent upon the percentage of indium in the phase of indium-germanium alloy. Variations in temperature vary the percentage of indium in the indium-germanium system, i.e., as the temperature increases, more germanium is dissolved in the same amount of liquid indium. Thus, variation in temperature varies the amount and depth of indium-germanium melt in the base 10. Due to the uniform heat distribution in the narrow base, it is accomplished that the melt at a certain temperature at the interface is distributed evenly across the area and yields a uniform and consistent depth of alloying. This is a desirable goal in the production of devices, since depth of alloying is related to "punch-through" voltage decrease. (Punch-through is a blocking voltage which reaches through the entire base of a completed transistor and limits operation beyond this voltage.) The voltage is related to the total effective base width, and the base impurity concentration. Starting out with a uniform impurity concentration and a uniform base thickness, consistent depth of alloying will cause a consistently reduced base width, and results in maintaining predesigned punch-through voltages. With 0.5 ohm cm. base material etched to a web thickness of 0.15 mil, it is possible to maintain depth of alloying to 0.01 mil within 20%. This in turn gives a punch-through voltage of 15.6 volts ±1 volt.

Figure 7:
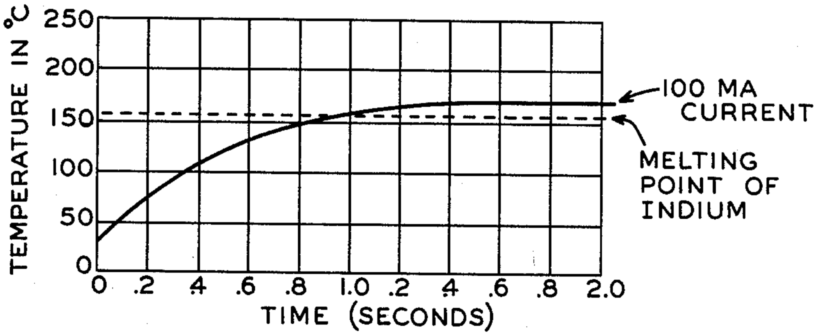
FIGURE 7 is a chart showing the temperature response for a constant current flowing through the interface plotted against the time of the current period.

FIGURE 7 relates the temperature in the thin web 18 to the time of current flow at 100 milliamperes in a certain geometry. The temperature rise is given by $$\Delta T=T_{\max}\left[1-\exp\left(\frac{-t}{t_0}\right)\right]$$

where $t_0$ is the thermal time constant for the system. For our design, the thermal time constant is of such a magnitude that equilibrium is established and the maximum temperature $T_{max}$ is maintained after 1 second. Different currents will establish various desirable $T_{max}$ at the same $t_0$. In order to microalloy, $T_{max}$ should be always greater than the melting point of the material to be microalloyed, in our case indium, and therefore, $T_{max}>155°$ C.

Figure 8:
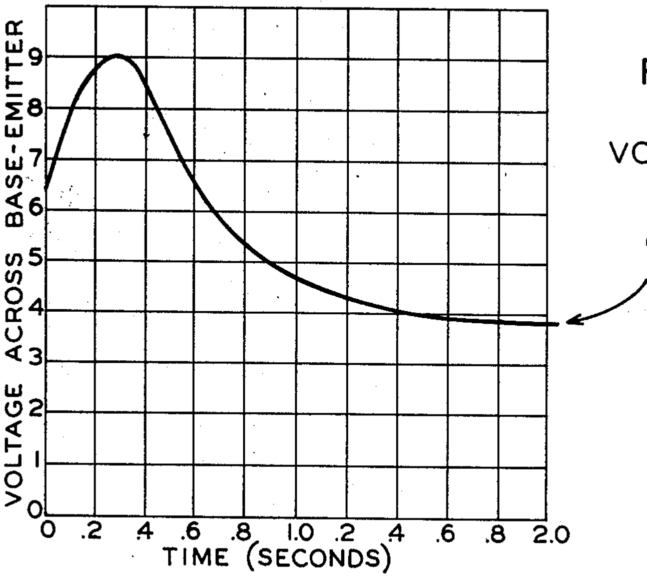
FIGURE 8 is a chart showing the voltage drop across emitter-to-base of the same constant current through the interface plotted against time.
Figure 9:
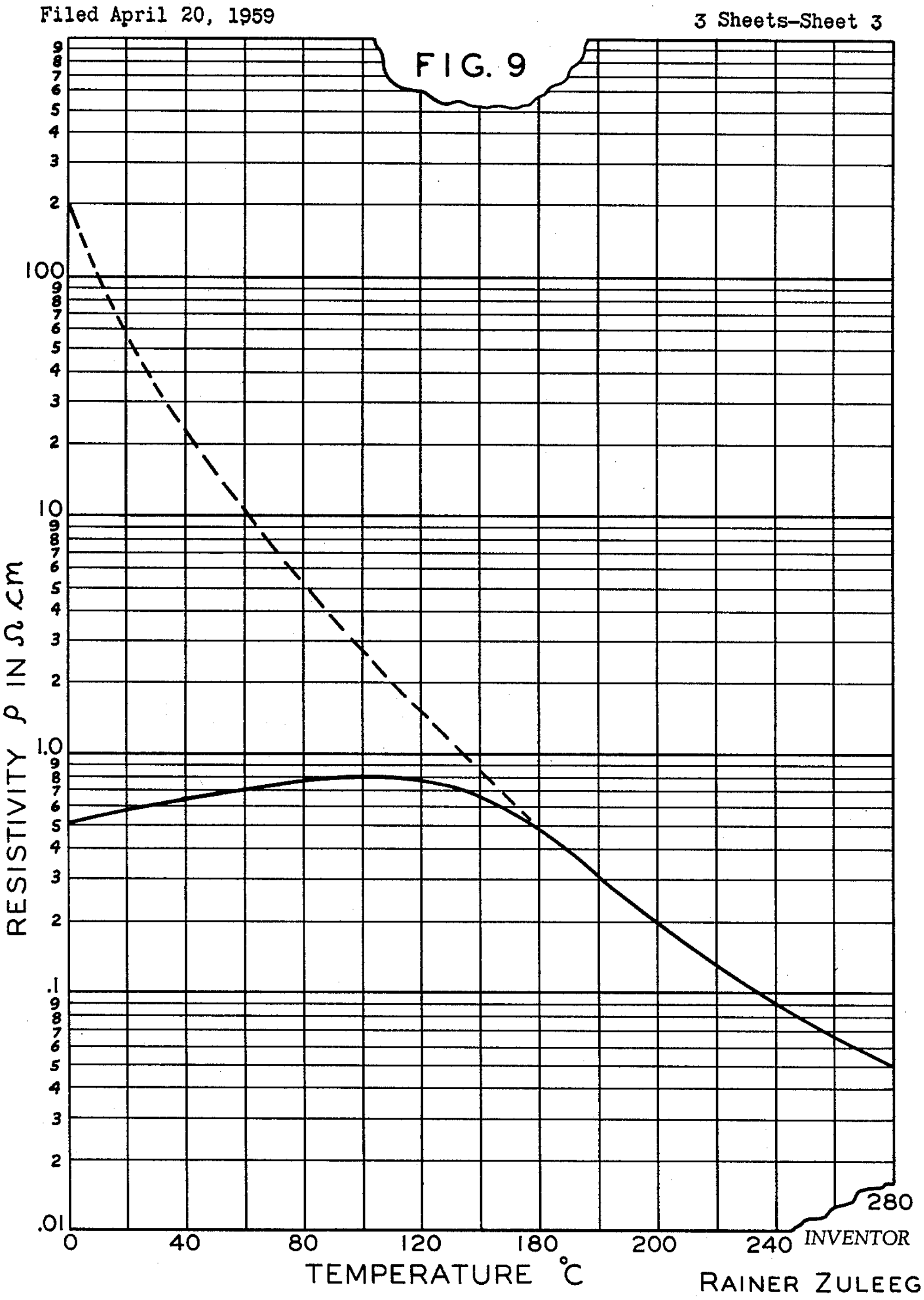
FIGURE 9 is a chart showing the change at base resistivity with temperature in 0.5 ohm cm. doped n-type germanium.

During the constant current cycle, the voltage pattern across base to emitter is given in FIGURE 8 for the temperature graph of FIGURE 7. Since the current is constant and Ohm's law has to be obeyed, we find that $V_{BE}$=const. $(R_B)$ which means that the voltage $V_{BE}$ is proportional to the base resistance and any voltage variation reflects a change in base resistance. Furthermore, the base resistance, $R_B$, is proportional to the resistivity of the base material. Therefore, the emitter to base voltage $V_{EB}$ should be proportional to the resistivity $\rho_B$. The resistivity of doped germanium depends on temperature and FIGURE 9 shows the behavior of 0.6 ohm cm. material. By comparison of FIGURE 8 and FIGURE 9, one can determine the temperature in the base. A voltage measurement can therefore be used by aid of other theoretical means, to acertain temperature control during the alloying process. This is of utmost importance, since the constant temperature warrants the consistant functioning of the invention.

The following example of microalloying of an indium emitter contact to a germanium base material is set forth for the purpose of illustration and is not limitative.

*Example I*

A constant current of 100 ma. and a duration of 2 seconds was applied to the following transistor preassembly: An N-type (Sb doped) germanium wafer having dimensions of 75 x 150 x 4 mils was provided with etched pits on both sides, forming a controlled web thickness of 0.15 mil. In one of said pits was an indium plating of 5 mils diameter (about 1 mil thick) which was in contact with a nickel-cadmium whisker wire plated with a dot of indium 5–7 mils in diameter containing ~1% gallium. The indium plating was microalloyed to the germanium base by the constant current method and a collector was attached by a soldering operation at a lower temperature. A pnp transistor of uniform electrical characteristics was thus fabricated. The unit had the following properties: Microalloying depth of 0.01 mil, as determined from punch-through voltage measurements before and after microalloying; and punch-through voltage of $V_p=-12$ v.

Other electrical parameters, tested at a collector-to-base voltage of −3 volts and a collector current of −1 milliampere were:

Emitter resistance $r_e=28$ ohms
Collector resistance $r_c=1.2$ megohms
Grounded base current gain $\alpha=0.993$
Grounded emitter current gain $\beta=143$ (*AT* $Ic=-1$ ma.)
Grounded emitter current gain $\beta=122$ (*AT* $Ic=-100$ ma.)
Collector capacitance $C_{ob}=3.4$ micromicrofarad
Maximum frequency of oscillation $f_{max}=64$ megacycles/second
Collector to base breakdown voltage $BV_{CB}=-22$ volts
Emitter to base breakdown voltage at 1 ma. $BV_{eB}=-26$ volts
Collector to emitter breakdown voltage at 1 ma. $BV_{CE}=-10$ volts The phenomenon of this invention resulting in the controlled microalloying of indium with germanium through a constant current of electricity biased from the emitter into the germanium base results in the desired uniform junction described above. This phenomenon may result from the fact that the carriers of current, that is, the electrons, also transport heat. Thus, as the electrons flow from hot to cold, they spread the high temperature of the hot region into the cold region. The electrons in the germanium base flow from the base contact into the emitter contact. Thus, it is suggested that the temperature is carried in this process. It is also suggested that the phenomenon may be the Peltier effect. The factor of Peltier heating would result from the Peltier coefficient at the interface resulting from electric current when it flows across the junction causing a heating of the junction.

The depth of alloying resulting from this phenomenon is clearly the result of the constant D.C. current which, in turn, gives the defined temperature. The whisker wire conducting the current is short and its length is not critical. The process gives uniform results regardless of the length of wire.

The microalloying process is subject to such a high degree of precision that it is adaptable to automatic operation. One of the advantages of this invention is the close relation of temperature to voltage in the microalloying process. Consequently, it is possible to operate the current switching by electronic switching devices which automatically turn off the constant current when the desired temperature is reached. It will be understood that such control based on voltage measurements permits a high degree of uniformity in successive alloying operations, and thus provides a means for mass production of microalloy transistors with control and uniformity of the electrical characteristics. The yield figures for emitter contacts connected to transistor bases by this process are excellent. This is a result of the uniformity and consistency of the microalloying and the close control of the electrical characteristics that can be exercised in carrying out the process. Further, consistent punch-through voltage decrease is obtained.

Another advantage of this invention is the uniformity and the regularity of the junction at the emitter contact. This method of heating applies the heat at the junction and at the germanium surface to which the emitter is bonded. Any volatile material evaporates from the germanium surface which is heated and the germanium surface does not receive material evaporated from other surfaces. This results in lower reverse currents than has been heretofore obtainable in diodes made by microalloying. The advantages of the heat control obtained by this method have been pointed out above, as has the advantage of the circular heat zone which results in a more homogeneous temperature distribution over the junction area. It was also pointed out above that the inward recrystallization from the outside resulted in a separation of the gallium and a concentration of the gallium adjacent the junction, which is highly desirable because of the hole injection efficiency of the gallium material. This process provides an easy method for producing both npn and pnp junction transistors and therefore a satisfactory np junction is one of the advances of this invention.

It is a feature of this invention that the depth of penetration of the microalloy into the base is a function of the phase diagram of the microalloyed materials, and of the temperatures reached in alloying. It is another feature of this invention that a close temperature control and temperature indication can be achieved by using a direct current passed through the contact in the forward direction as the means to generate heat. While the invention has been described in the preferred terms of direct current, it should be understood that it is within the contemplation of the scope of the invention that pulsating direct current or other non-uniform currents may be utilized. Still another feature of this invention is the use of the voltage drop, that is produced across the semiconductor body during the current flow, to monitor the temperature rise in the body so as to switch off the heating current when the predetermined temperature has been reached.

This invention has been described in the above-preferred embodiment as incorporated in a narrow web transistor. The geometry of the transistor body to which this invention is applied is not limited to the narrow web cross-section, and other transistors may be fabricated according to this invention. It will be understood that in various transistor body geometries a constant current from a timed source may establish a temperature in relation to a rectifying junction to cause the microalloying of the materials of opposite conductivity as described above.

One such modification of structure may be found in a mesa type body. In this modified structure the narrow region is provided in which the determinable maximum temperature may be produced. Similarly, the procedures described above in connection with the control from a timed source of constant current may be employed in this mesa type geometry to bring about the desired uniform recrystallization of the molten conductivity materials.

Other modifications of the described preferred embodiment may be made within the skill of the art. For example, in the above example of the microalloying of indium and germanium with gallium, the gallium may be replaced by other segregating metals, such as aluminum. Other adaptations are readily apparent; therefore it is intended that the invention be limited only by the scope of the appended claim.

What is claimed is:

A process for microalloying a material that promotes one conductivity type to a semiconductive material of opposite conductivity type which comprises the steps of plating a first material of one conductivity type on the surface of a relatively thin base region in a semiconductor body of a second material of opposite conductivity type having a thin base region and a relatively thicker base region, contacting to the plated material a plated lead element having the one conductivity type, passing a positive constant D.C. current in the forward direction of electron flow through the contact under a lead element-to-body voltage proportional to the resistivity of the second material, developing a voltage drop across the resistance of the body, said voltage drop being related to the resistivity of the body, heating the relatively thin base region including Joule heating, establishing said voltage potential between the lead element and the body to determine the heating of the relatively thin base region, confining the heating to the relatively thin base region with said constant current flow, homogeneously distributing the heat in the heat zone around and under the plated material, continuing the current to provide a temperature in the relatively thin base region above the melting point of the plating one conductivity type material to produce a molten alloy phase and distributing the melt evenly at the interface across the area to produce microalloy and solidifying said alloy by cessation of said current.

References Cited in the file of this patent

UNITED STATES PATENTS

| | | |
|---|---|---|
| 2,653,374 | Mathews et al. | Sept. 29, 1953 |
| 2,654,059 | Shockley | Sept. 29, 1953 |
| 2,697,269 | Fuller | Dec. 21, 1954 |
| 2,792,538 | Pfann | May 14, 1957 |
| 2,845,375 | Gobalt et al. | July 29, 1958 |
| 2,847,336 | Pankove | Aug. 12, 1958 |
| 2,862,160 | Ross | Nov. 25, 1958 |
| 2,866,140 | Jones et al. | Dec. 23, 1958 |
| 2,870,052 | Rittmann | Jan. 20, 1959 |
| 2,894,184 | Veach et al. | July 7, 1959 |
| 2,916,408 | Freedman | Dec. 8, 1959 |
| 2,942,166 | Michlin | June 21, 1960 |
| 2,959,505 | Riesz | Nov. 8, 1960 |
| 2,968,751 | Mueller et al. | Jan. 17, 1961 |
| 3,001,112 | Murad | Sept. 19, 1961 |

FOREIGN PATENTS

| | | |
|---|---|---|
| 742,237 | Great Britain | Dec. 21, 1955 |